United States Patent
Kinoshita

(10) Patent No.: US 8,237,360 B2
(45) Date of Patent: Aug. 7, 2012

(54) COLOR DISPLAY DEVICE HAVING WHITE SUB-PIXELS AND EMBEDDED LIGHT REFLECTIVE LAYERS

(75) Inventor: Masaru Kinoshita, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 135 days.

(21) Appl. No.: 12/544,239

(22) Filed: Aug. 20, 2009

(65) Prior Publication Data

US 2010/0052524 A1 Mar. 4, 2010

(30) Foreign Application Priority Data

Aug. 29, 2008 (JP) ................ 2008-221881

(51) Int. Cl.
*H01J 1/54* (2006.01)
*H01L 21/77* (2006.01)

(52) U.S. Cl. ......... 313/506; 313/507; 313/508; 445/24; 445/25; 257/40

(58) Field of Classification Search ........... 313/500–512
See application file for complete search history.

(56) References Cited

U.S. PATENT DOCUMENTS

| | | | | |
|---|---|---|---|---|
| 2005/0225232 A1* | 10/2005 | Boroson et al. | ............... | 313/504 |
| 2006/0214573 A1* | 9/2006 | Maeda et al. | ............... | 313/506 |
| 2009/0051283 A1* | 2/2009 | Cok et al. | ............... | 313/506 |

FOREIGN PATENT DOCUMENTS

| | | |
|---|---|---|
| JP | 2006-269329 A | 10/2006 |
| JP | 2007-503093 A | 2/2007 |
| JP | 2007108248 | 4/2007 |
| JP | 2007108249 | 4/2007 |
| JP | 2007141789 | 6/2007 |
| JP | 2008071664 | 11/2011 |

OTHER PUBLICATIONS

Japanese Office Action dated May 8, 2012 issued in the corresponding Japanese Application.

* cited by examiner

*Primary Examiner* — Tracie Y Green
(74) *Attorney, Agent, or Firm* — SOLARIS Intellectual Property Group, PLLC

(57) ABSTRACT

Disclosed is a color display device containing plural pixels on a substrate, each pixel is composed of plural sub-pixels which emit lights different in wavelength in the visible range and a white sub-pixel, the plural sub-pixels and the white sub-pixel each have a white organic electroluminescence layer interposed between an optically semitransparent reflection layer and a light reflection layer, the optical distance between the optically semitransparent reflection layer and the light reflection layer in each of the plural sub-pixels forms a resonator having a distance for resonating emitted light, and the optical distance between the optically semitransparent reflection layer and the light reflection layer in the white sub-pixel is longer than the maximum optical distance between the optically semitransparent reflection layer and the light reflection layer in each of the plural sub-pixels.

13 Claims, 7 Drawing Sheets

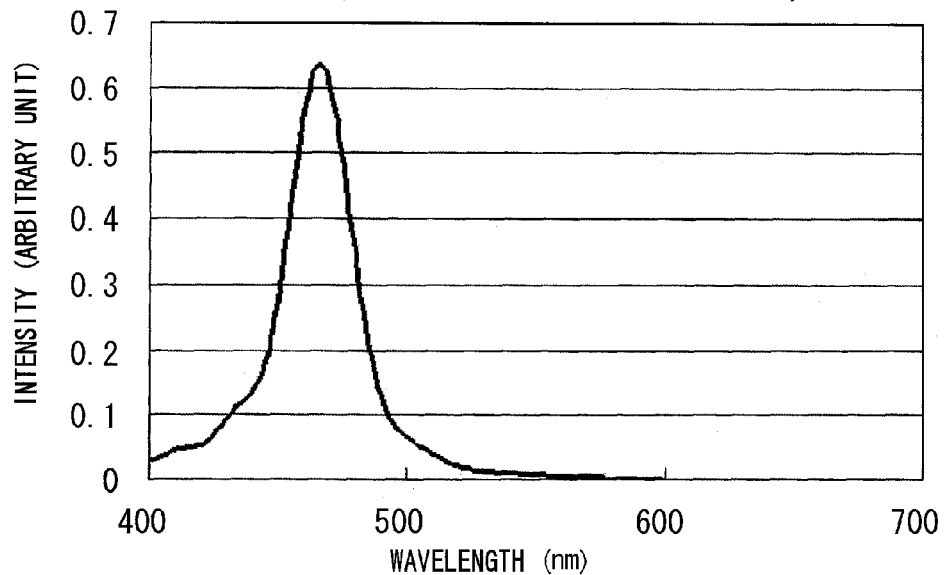
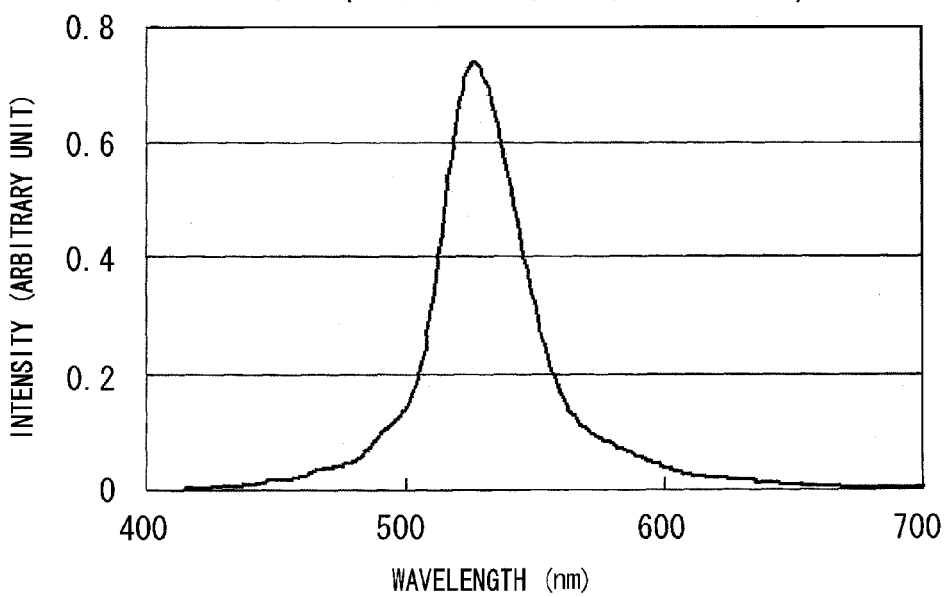

R PIXEL (RESONANCE OPTICAL DISTANCE 520nm)

W PIXEL (RESONANCE OPTICAL DISTANCE 2μm)

COLOR DISPLAY DEVICE HAVING WHITE SUB-PIXELS AND EMBEDDED LIGHT REFLECTIVE LAYERS

CROSS-REFERENCE TO RELATED APPLICATION

This application claims priority under 35 USC 119 from Japanese Patent Application No. 2008-221881 filed on Aug. 29, 2008, the disclosure of which is incorporated by reference herein.

BACKGROUND

1. Field of the Invention

The present invention relates to a color display device using an electroluminescent device and a method for manufacturing the same.

2. Related Art

In recent years, thin and lightweight flat panel displays have been substituted for cathode ray tubes (CRTs) in various fields, and their applications are expanding. This is because personal information terminals such as personal computers and network access-compatible cell phones are acceleratingly spreading due to development of information equipments and infrastructures for services network with internet as a core. Further, the market of flat panel displays is expanding to household-use televisions that have conventionally been in the exclusive province of CRTs Among them, there is an organic electroluminescent device (also referred to hereinafter as "organic EL device") as a device attracting attention particularly in recent years. The organic EL device is an element that emits light according to electrical signals and is composed of an organic compound as a light-emitting material. The organic EL device inherently has excellent display properties such as wide viewing angle, high contrast and high-speed response. The organic EL device is capable of realizing thin, lightweight and high-definition display devices ranging in size from small to large, and thus attracts attention as an element substituted for CRT or LCD.

Various proposes have been made of full-color display devices using the organic EL device.

For example, as a method of attaining the three basic colors of red (R), green (G) and blue (B) for full-color display, there is a separate forming method in three colors or a method of combining color filters with a white organic EL device.

In the separate forming method in three colors, there is a possibility that higher efficiency can be achieved by arranging three-color suitable materials as coloring materials and by reducing a loss in a circularly polarizing plate. However, the separate forming technique is difficult so that realization of high-definition or large-sized displays is regarded as difficult.

In the method of combining color filters with a white organic EL device to attain the three colors, there is a problem that the luminous efficiency of a white color-emitting material itself is low, and the luminance is reduced by the color filters to about ⅓.

Various improvements have been made in a method of obtaining desired colors by converting the color of light from an organic EL device with a color conversion film, but there are problems such as low efficiency of conversion to red color, and the like.

There is an investigation in which a semitransparent cathode is used as an upper electrode, and by the multiple interference thereof with a reflection film, only light of specific wavelength is picked out of an organic EL device, to realize high color reproducibility. For example, an organic EL device is known wherein a first electrode consisting of a light reflection material, an organic layer provided with an organic light-emitting layer, a semitransparent reflection layer, and a second electrode consisting of a transparent material are laminated in this order and the organic layer is constituted to serve as a resonating region, wherein when the peak wavelength of a spectrum of light to be picked out is λ, the organic EL device is constituted to satisfy the following equation:

$$(2L)/\lambda + \Phi/(2\pi) = m$$

wherein L is an optical distance, λ is the wavelength of light to be picked out, m is an integer, and Φ is phase shift, and the optical distance L is constituted to be a positive minimum value.

For example, an organic EL display device provided with a micro-cavity (minute resonator) is disclosed (see, for example, Japanese National-Phase Publication No. 2007-503093). Specifically, one pixel is divided into red (R), green (G) and blue (B) sub-pixels each constituting a resonator for resonating emitted light between an optically semitransparent reflection electrode and a reflection film (electrode) and having an organic EL light-emitting layer in common among the sub-pixels, thus making separate forming in three colors unnecessary and a color filter also unnecessary, thereby being assumed to provide a simple full-color display device. A resonant is not arranged in a white sub-pixel region. This is because from the principle of a resonant that resonates light of specific wavelength only, arrangement of a resonant in the white sub-pixel region is not suitable for emitting white light having an emission spectrum in the whole visible range. In the white sub-pixel region, therefore, a transparent electrode is used in place of the optically semitransparent reflection electrode, and separate forming of the white sub-pixel from the R, G and B sub-pixels is thus made necessary. Accordingly, higher resolution is hardly attained, and the process is unfavorably complicated.

A light-emitting device wherein a resonant structure is formed by changing the thickness of an anode for an organic electroluminescence layer, thereby picking out R, G and B lights, is disclosed (see, for example, Japanese Patent Application Laid-Open (JP-A) No. 2006-269329). As the anode, a transparent electroconductive material such as ITO is used, and a light reflection film is arranged via a transparent insulation film in the lower part of the anode.

In a full-color display device, a white sub-pixel is important for simultaneously achieving rich color reproduction, tone reproduction and low power consumption, and it is desired to solve the problems in arrangement of the white sub-pixel.

SUMMARY

The present invention has been made in view of the above circumstances and provides a color display device and a method for manufacturing the same.

A first aspect of the invention provides a color display device comprising a plurality of pixels on a substrate, wherein each pixel comprises a plurality of sub-pixels, each sub-pixel emits light of different wavelengths in the visible range and further comprises a white sub-pixel, wherein the plurality of sub-pixels and the white sub-pixel each have a white organic electroluminescence layer interposed between an optically semitransparent reflection layer and a light reflection layer, the optical distance between the optically semitransparent reflection layer and the light reflection layer in each of the plurality of sub-pixels forms a resonator having a distance for resonating emitted light, and the optical distance between the optically semitransparent reflection layer and the light reflection layer in the white sub-pixel is longer than the maximum optical distance between the optically semitransparent reflection layer and the light reflection layer in each of the plurality of sub-pixels.

BRIEF DESCRIPTION OF THE DRAWINGS

Exemplary embodiments of the present invention will be described in detail based on the following figures, wherein:

FIG. 6 is one example of a spectrum of light emitted from the B sub-pixel in the invention;

FIG. 7 is one example of a spectrum of light emitted from the G sub-pixel in the invention;

DETAILED DESCRIPTION OF THE INVENTION

Hereinafter, the present invention will be described in more detail.
1. Display Device The display device of the invention includes plural pixels on a substrate, each pixel contains two or more sub-pixels, each sub-pixel emits light of different wavelength in the visible range and further contains a white sub-pixel.

Figure 1:
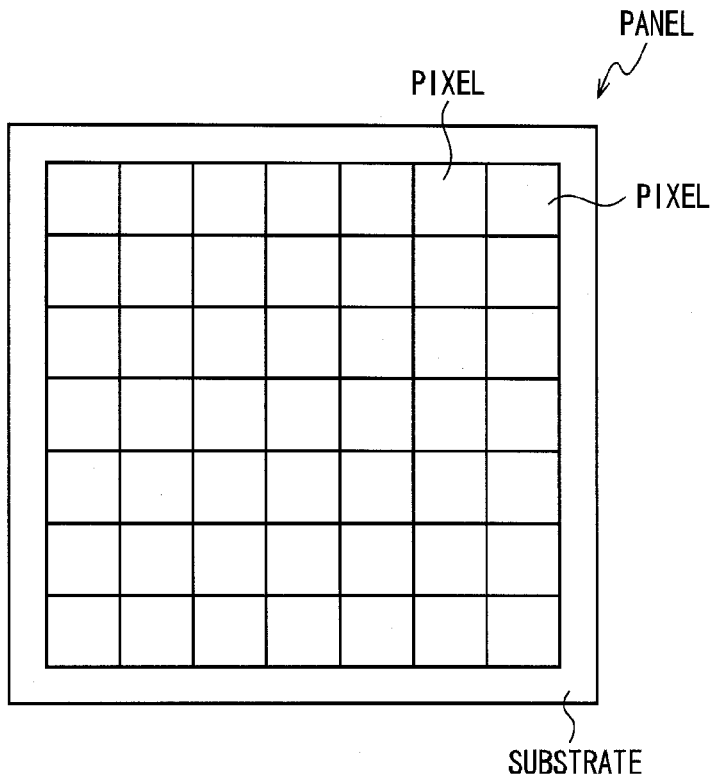
FIG. 1 is a conceptual diagram of arrangement of pixels in a matrix-type display device.

As shown in FIG. 1, the display device of the invention has a matrix-type screen panel having plural pixels arranged lengthwise and breadthwise on a substrate. Each pixel contains plural sub-pixels, each sub-pixel emits light of different wavelengths in the visible range and further contains a white sub-pixel and each sub-pixel forms a resonator. These sub-pixels are independently regulated and allowed to emit lights with independent luminance, thereby enabling full-color reproduction.

Figure 2:
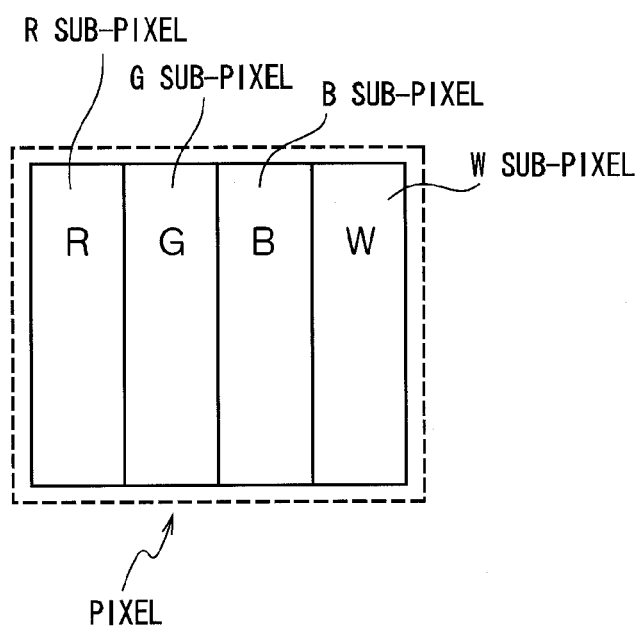
FIG. 2 is a conceptual diagram showing arrangement of sub-pixels in one pixel.

Preferably, each pixel is composed of a red (R) sub-pixel, a green (G) sub-pixel, a blue (B) sub-pixel and a white (W) sub-pixel. FIG. 2 is a conceptual diagram showing the arrangement of sub-pixels.

The color display device of the invention includes plural pixels on a substrate, each pixel contains plural sub-pixels, each sub-pixel emits light of different wavelengths in the visible range, and further contains a white sub-pixel, wherein the plural sub-pixels and the white sub-pixel each have a white-light emitting organic electroluminescence layer interposed between an optically semitransparent reflection layer and a light reflection layer, the optical distance between the optically semitransparent reflection layer and the light reflection layer in each of the plural sub-pixels forms a resonator having a distance for resonating emitted light, and the optical distance between the optically semitransparent reflection layer and the light reflection layer in the white sub-pixel is longer than the maximum optical distance between the optically semitransparent reflection layer and the light reflection layer in each of the plural sub-pixels.

Preferably, the display device has, as the plural sub-pixels, a red sub-pixel (R sub-pixel), a green sub-pixel (G sub-pixel) and a blue sub-pixel (B sub-pixel), and the optical distances between the optically semitransparent reflection layer and the light reflection layer in the red sub-pixel, green sub-pixel and blue sub-pixel are distances with which red light (R light), green light (G light) and blue light (B light) are resonated respectively.

Preferably, the optical distance between the optically semitransparent reflection layer and the light reflection layer in the white sub-pixel is equal to or longer than twice the maximum optical distance between the optically semitransparent reflection layer and the light reflection layer in each of the plural sub-pixels.

Preferably, the optical distance between the optically semitransparent reflection layer and the light reflection layer in the white sub-pixel is 2.0 µm or more, more preferably 3.0 µm or more, even more preferably 4.0 µm or more.

Preferably, each sub-pixel has an optical path length regulation layer between the optically semitransparent reflection layer and the light reflection layer, and the plural sub-pixels and the white sub-pixel each have a white organic electroluminescence layer having the same composition and are different in only the thickness of the optical path length regulation layer.

The display device of the invention is preferably provided in each sub-pixel region with a TFT for driving each sub-pixel. Preferably, the substrate for the display device of the invention uses, as the substrate, a substrate for a TFT, and at least one of the sub-pixels has a planarized film on the substrate and a light reflection layer on the planarized film. Further, a light path length regulation layer, a white organic luminescence layer and an optically semitransparent reflection layer are arranged on the light reflection layer.

In another preferable aspect, each sub-pixel has the light reflection layer either between the planarizing film and the substrate or in the planarizing film. In this case, at least a part of the planarizing film functions as an optical path length regulation layer.

In a preferable specific aspect, the red sub-pixel, the green sub-pixel, the blue sub-pixel and the white sub-pixel each have, on the planarizing film, a light reflection layer, an optically semitransparent reflection layer and an optical path length regulation layer and a white light-emitting organic luminescence layer interposed between the optically semitransparent reflection layer and the light reflection layer.

In another preferable specific aspect, the red sub-pixel, the green sub-pixel and the blue sub-pixel each have, on the planarizing film, a light reflection layer, an optically semitransparent reflection layer and an optical path length regulation layer and a white organic luminescence layer interposed between the optically semitransparent reflection layer and the light reflection layer, and the white sub-pixel has a light reflection layer between a substrate and a planarizing film and has, on the planarizing film, a transparent electrode, a white organic luminescence layer, and an optically semitransparent reflection layer.

Preferably, the light reflection layer of the white sub-pixel is formed at a layer common with an electrode of a TFT.

Preferably, a red color filter, a green color filter and a blue color filter are arranged at the light emission side of the red light-emitting sub-pixel, green light-emitting sub-pixel and blue light-emitting sub-pixel, respectively.

The organic EL in the invention may be a top emission-type organic EL or a bottom emission-type organic EL.

Now, the constitution of the display device of the invention will be described specifically with reference to the drawings.

Figure 3:
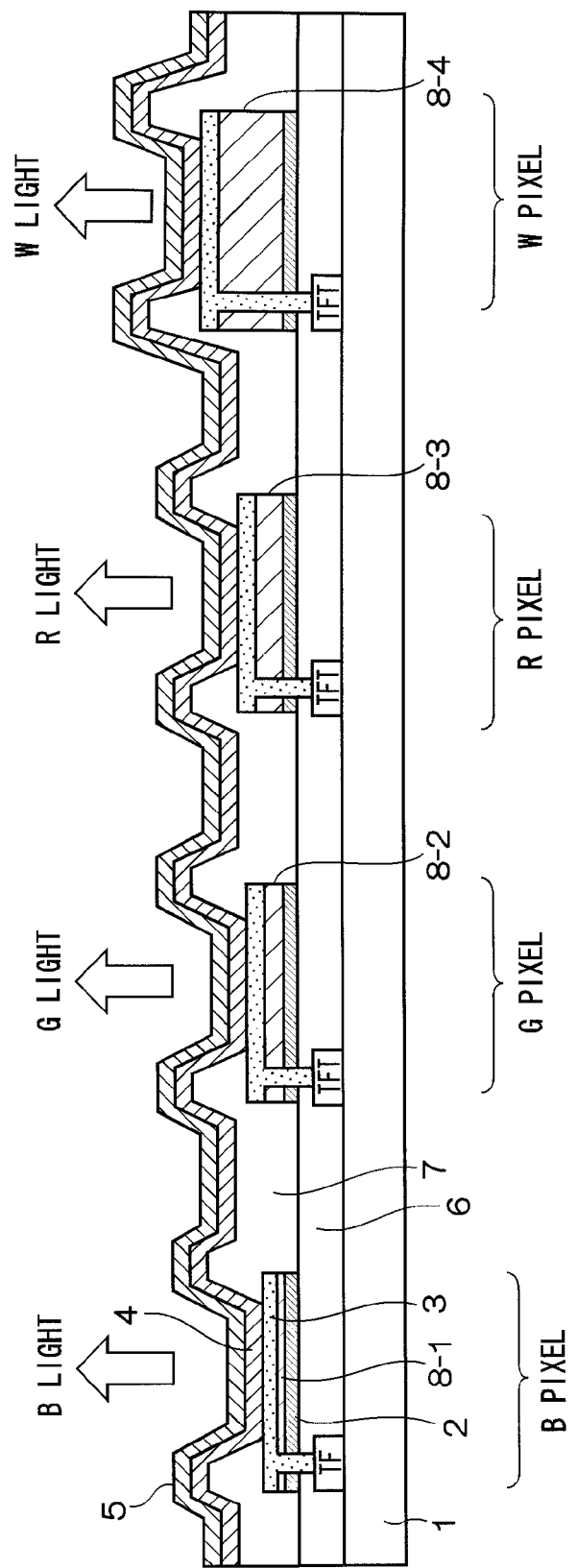
FIG. 3 is a schematic sectional view of one pixel in an exemplary aspect of the invention.

FIG. 3 is a sectional schematic diagram showing the constitution of R, G and B sub-pixels and W sub-pixel constituting one pixel in the invention.

On substrate 1 provided with TFT, a planarizing film 6 is formed by coverage on TFT. A light reflection layer 2 is arranged on the planarizing film. When insulation properties with a pixel electrode (transparent electrode 3) are maintained, the light reflection layer may be arranged in common among R, G, B and W sub-pixels.

Then, optical path length regulation layers that are different in thickness among the R, G, B and W sub-pixels are arranged respectively (that is, optical path length regulation layers 8-1, 8-2, 8-3 and 8-4). The optical path length regulation layer 8-1 in the B sub-pixel region is thinnest, and as long as the B sub-pixel region attains a resonance distance, the thickness may be 0, that is, the optical path length regulation layer may not be arranged in the B sub-pixel region. The optical path length regulation layer in the R sub-pixel region is thicker than in the G sub-pixel region. The optical path length regulation layer 8-4 in the W sub-pixel region is thickest and is preferably thicker than the optical path length regulation layer 8-3 in the R sub-pixel region, more preferably thicker than twice the optical path length regulation layer 8-3 in the R sub-pixel region. Preferably the optical path length regulation layer is electrically insulating.

A transparent electrode 3 is arranged as a pixel electrode by patterning on the optical path length regulation layer for each pixel. The transparent electrode 3 is connected electrically via a contact hole to TFT.

The non-light-emitting regions in spaces among the sub-pixels are covered with a bank 7 (insulating layer).

A white organic luminescence layer 4 and an optically semitransparent reflection layer 5 are arranged thereon in common among the respective sub-pixels. The white organic electroluminescence layer 4 is preferably a laminate of plural functional layers such as a hole injecting layer, a hole transporting layer, a light-emitting layer, an electron transporting layer, and an electron injecting layer. The optically semitransparent reflection layer 5 may be either a metallic thin film (Al, Ag etc.) or a distributed Bragg reflection film (DBR) wherein transparent thin films different in refractive index are laminated. The optical path length regulation layer is composed of an insulating layer material and may be any of inorganic materials ($SiO_2$, SiON, SiN etc.) and organic materials (polycarbonate, polyacrylate, silicone resin etc.).

Figure 8:
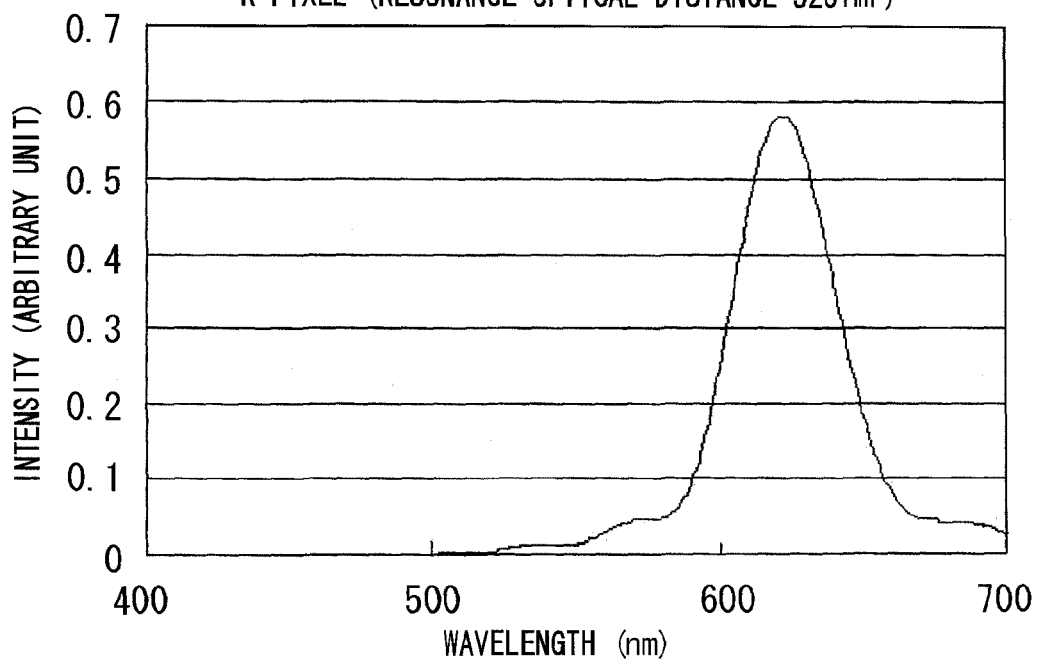
FIG. 8 is one example of a spectrum of light emitted from the R sub-pixel in the invention.

The thickness of the optical path length regulation in each of the R, G, and B sub-pixels is regulated so as to provide a distance with which emitted light resonates. For example, the film thickness of optical distance L with which optical resonance is generated for R ($\lambda$=625 nm to 740 nm), G ($\lambda$=500 nm to 565 nm) or B ($\lambda$=450 nm to 485 nm) is formed between the light reflection layer 2 and the optically semitransparent reflection layer 5. For example, when the resonance optical distance in the B sub-pixel region is 380 nm, emitted light having a maximum wavelength at 465 nm shown in FIG. 6 is picked out to the outside. When the resonance optical distance in the G sub-pixel region is 440 nm, emitted light having a maximum wavelength at 526 nm shown in FIG. 7 is picked out to the outside. When the resonance optical distance in the R sub-pixel region is 520 nm, emitted light having a maximum wavelength at 623 nm shown in FIG. 8 is picked out to the outside. Thus, each of R, G and B sub-pixels emits light of different wavelengths in the visible range.

Figure 9:
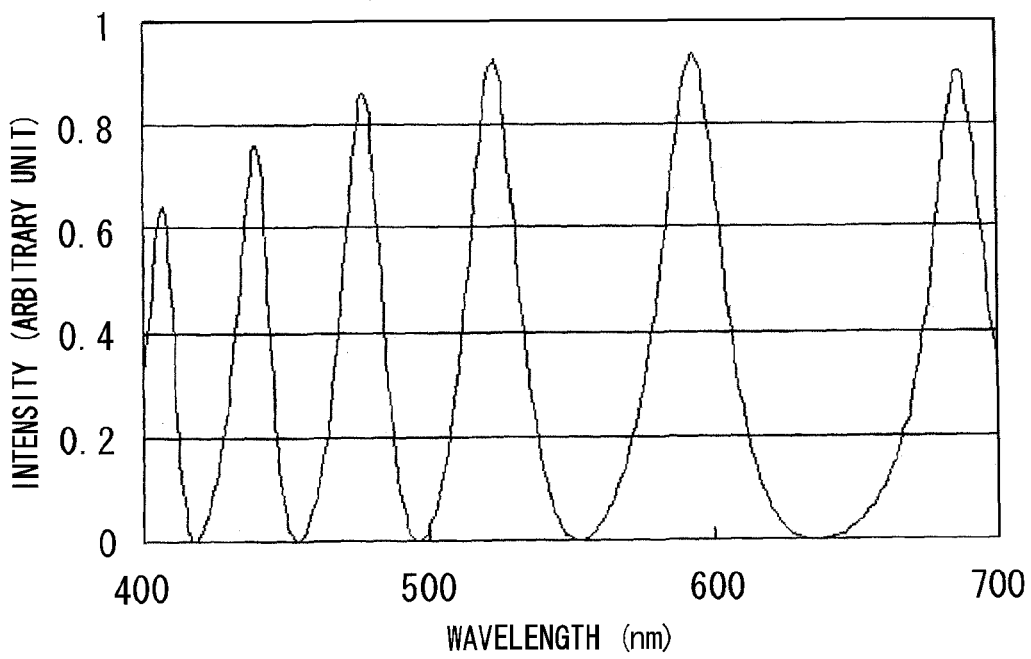
FIG. 9 is one example of a spectrum of light emitted from the W sub-pixel in the invention.
Figure 10:
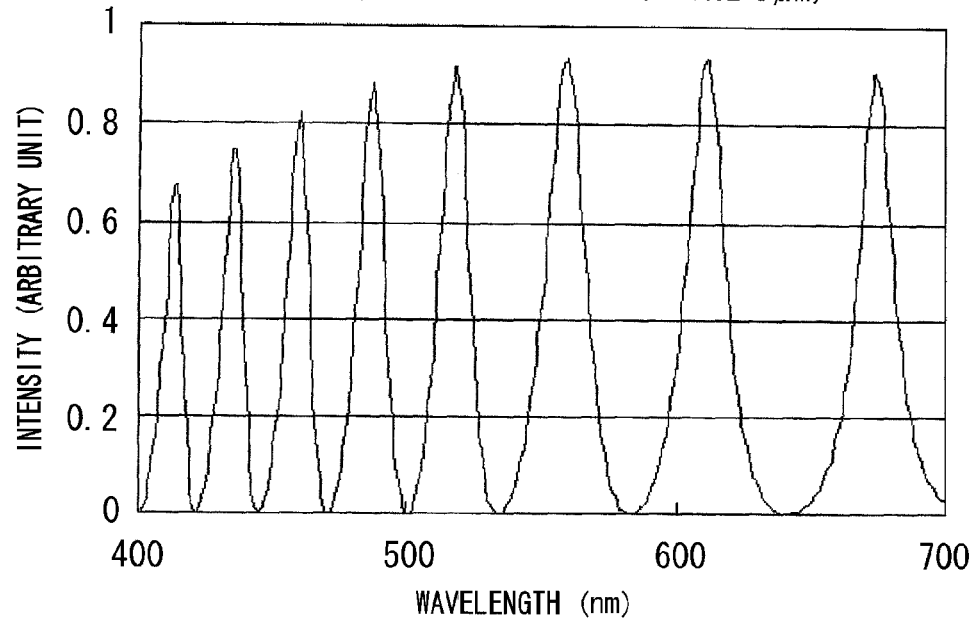
FIG. 10 is one example of a spectrum of light emitted from the W sub-pixel in the invention.
Figure 11:
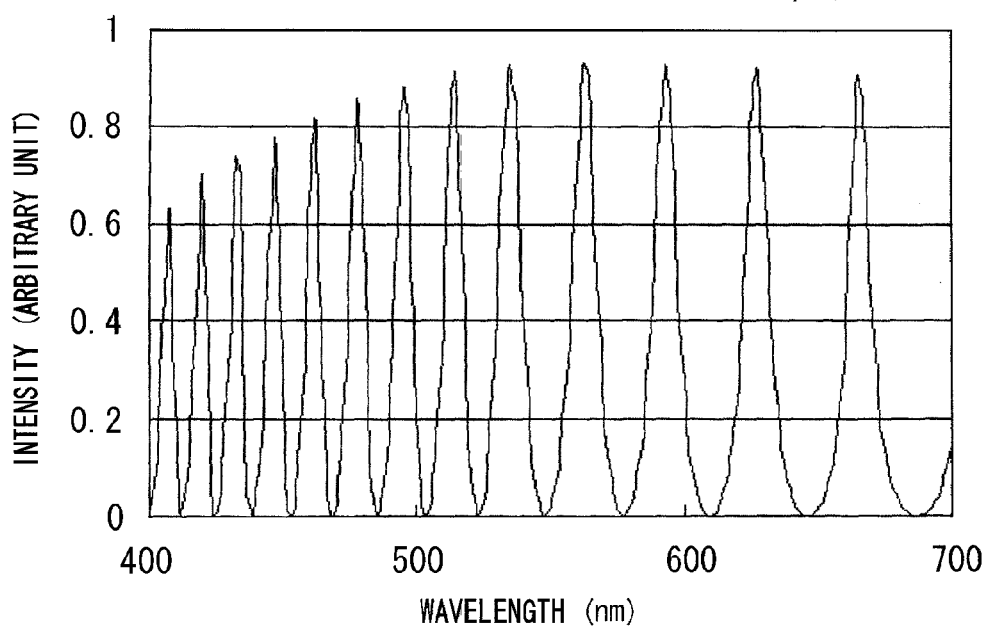
FIG. 11 is another example of a spectrum of light emitted from the W sub-pixel in the invention.

In the W sub-pixel region, on the other hand, the optical path length regulation layer is thicker than in the R sub-pixel region and is regulated to have such thickness as not to exhibit emission of light having a specific wavelength in the visible range. For example, when the resonance optical distance is 2.0 µm, lights with a resonance wave having many emission peaks as shown in FIG. 9 are picked out to the outside. Accordingly, the light of W sub-pixel observed outside is an almost white light having such lights mixed therein.

The lights emitted in the white organic electroluminescence layer 4 upon electrification are repeatedly reflected and resonated between the optically semitransparent reflection layer 5 and the light reflection layer 2 whereby R, G and B lights are emitted through the optically semitransparent reflection layer 5 to the outside. In the W sub-pixel, the R, G and B resonated lights are mixed and observed as white light.

Figure 4:
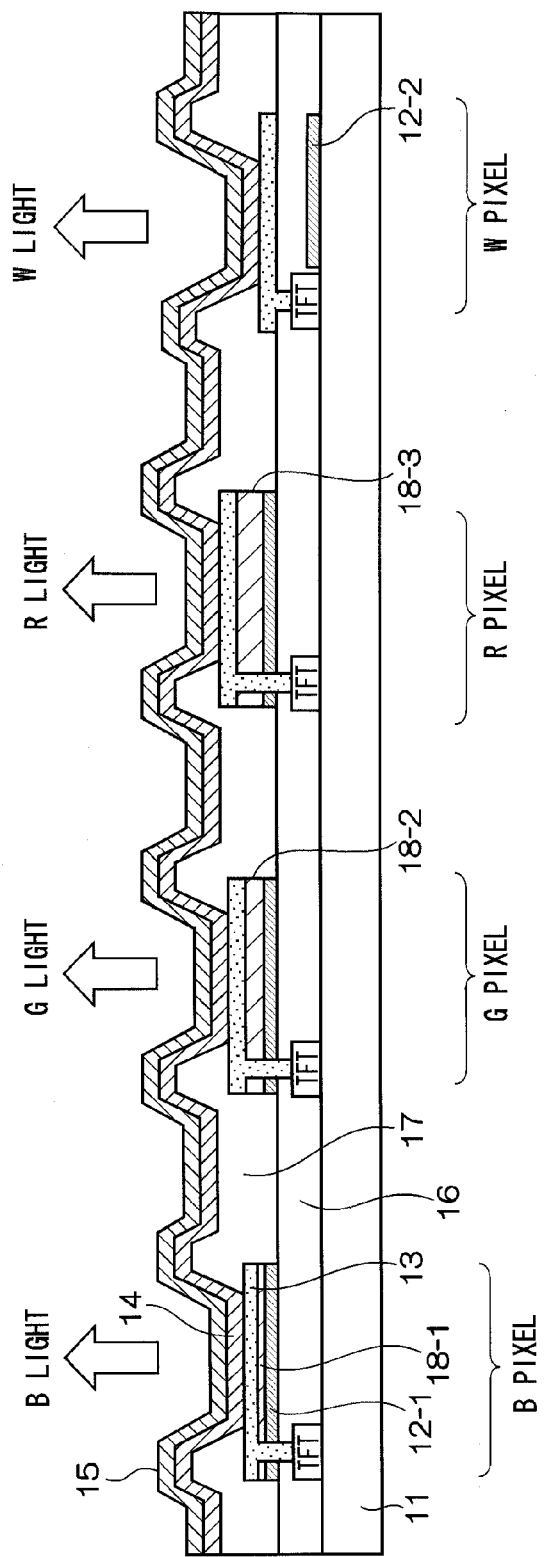
FIG. 4 is a schematic sectional view of one pixel in another aspect of the invention.

FIG. 4 is a sectional schematic diagram showing the constitution of one pixel in another aspect of the invention.

The constitution of the R, G and B sub-pixel regions is the same as the constitution shown in FIG. 3. For the W sub-pixel, a reflection layer 12-2 is first arranged in a region where the W sub-pixel is to be arranged on substrate 11 provided with TFT. TFT and the light reflection layer 12-2 are covered by arranging a planarizing film 16 thereon. The planarizing film is arranged as planarizing film 16 common among the R, G and B sub-pixel regions. In the W sub-pixel region, the planarizing film 16 functions as an optical path length regulation layer, wherein the thickness of the optical path length regulation layer in the W sub-pixel may be greater than a predetermined thickness and may thus not be strictly regulated. Accordingly, sufficiently satisfactory performance can be achieved even by a general manner of producing a planarizing film. In the FIG. 4, 12-1 represents an light refection layer and 18-1, 18-2 and 18-3 each represents an optical path length regulation layer.

Then, a transparent electrode 13 is arranged as a pixel electrode on the planarizing film 16 by patterning for each sub-pixel. The transparent electrode 13 is connected electrically via a contact hole to the TFT.

The non-light-emitting regions in spaces among the sub-pixels are covered with a bank 17 (insulating layer).

A white organic luminescence layer 14 and a optically semitransparent reflection layer 15 are arranged thereon in common among the sub-pixels.

When the optical distance between the light reflection layer 12-2 and the optically semitransparent reflection layer 15 in the W sub-pixel region is to be further increased, an optical path length regulation layer may be arranged between the planarizing film 16 and the transparent electrode 13.

Figure 5:
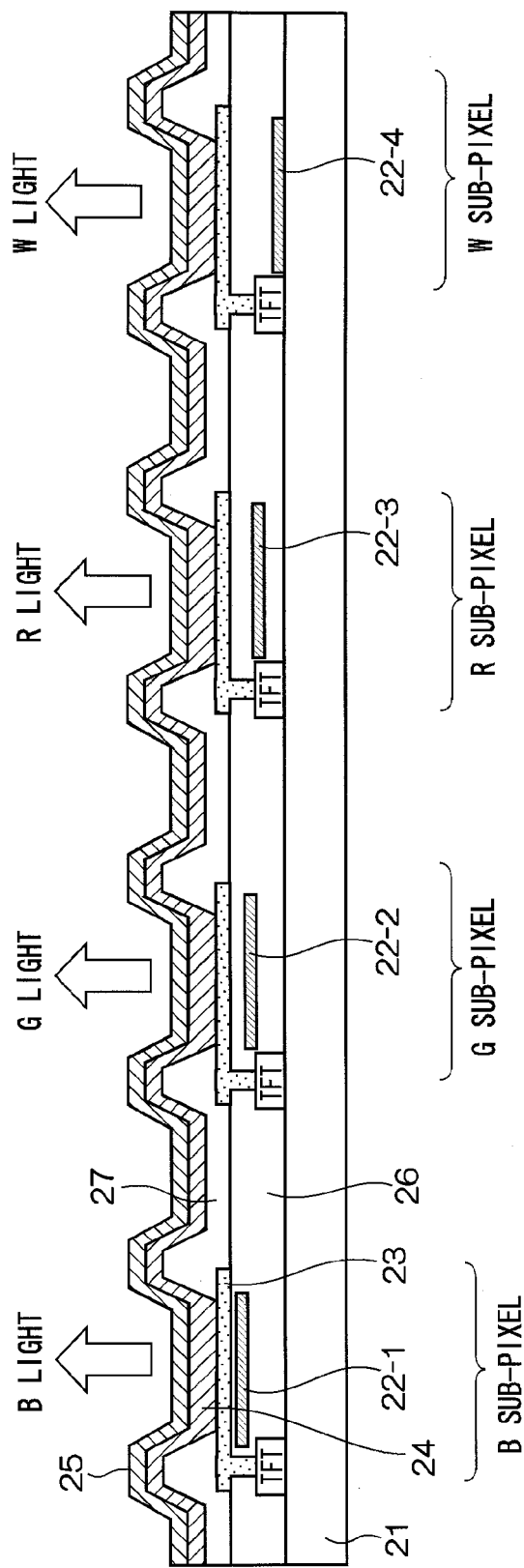
FIG. 5 is a schematic sectional view of one pixel in still another aspect of the invention.

FIG. 5 is a sectional schematic diagram showing the constitution of one pixel in still another aspect of the invention.

The constitution of the W sub-pixel region is the same as the constitution shown in FIG. 4.

In each of the R, G and B sub-pixel regions, the light reflection layer is arranged inside the planarizing film. In the B sub-pixel region, the light reflection layer 22-1 is arranged in the uppermost part of the planarizing film 26. The light reflection layers 22-2 and 22-3 in the G and R sub-pixel regions are arranged respectively inside the planarizing film 26 in such positions that the resonance distance in the R sub-pixel region becomes longer than that in the G sub-pixel region.

On the planarizing film 26, a patterned transparent electrode 23 is formed in the R, G, B and W sub-pixels, respectively.

A white organic luminescence layer 24 and a optically semitransparent reflection layer 25 are arranged thereon in common among the R, G, B and W sub-pixels. In the FIG. 5, 27 represents a bank.

It follows that according to the invention, the light emitted from each of the R, G and B sub-pixels is a light of high luminance and high chroma with a narrow spectrum distribution, whereby a light with extremely high luminance and high chroma is obtained. The light emitted from the W pixel region is not a resonance light having a limited number of specific wavelengths but a white light obtained by mixing of a large number of resonance lights so that a high-luminance white light can be obtained without such color drift as is observed in the conventional W pixel region having a resonator.

The white organic luminescence layer and semitransparent reflection layer can be formed consistently in common among the R, G, B and W sub-pixels, thus making achievement of higher resolution easy, facilitating the production process, and attaining high productivity.

2. Optical Path Length Regulation Layer

The optical path length regulation layer in the invention is not particularly limited as long as it is composed of a transparent insulating layer material, and such material may be any one of inorganic materials ($SiO_2$, SiON, SiN etc.) and organic materials (polycarbonate, polyacrylate, silicone resin etc.).

The inorganic insulating materials used in the optical path length regulation layer of the invention may be a wide variety of conventionally known metal oxides, metal nitrides and metal fluorides.

Specific examples of the metal oxides include MgO, SiO, $SiO_2$, $Al_2O_3$, GeO, NiO, CaO, BaO, $Fe_2O_3$, $Y_2O_3$, $TiO_2$ etc.; specific examples of the metal nitrides include $SiN_x$, $SiN_xO_y$, etc.; and specific examples of the metal fluorides include $MgF_2$, LiF, $AlF_3$, $CaF_2$ etc. The material may also be a mixture thereof.

As the material of the optical path length regulation layer of the invention, an organic compound may also be used, and a film-forming polymer is preferably used. The film-forming polymer includes polycarbonate, polyacrylate, silicone resin, polyvinyl butyral, etc.

The thickness of the optical path length regulation layer is regulated so as to constitute an optical distance with which each sub-pixel can efficiently resonate light of specific wavelength. Accordingly, the optical distance for resonance is determined depending on the refractive index, composition and thickness of the material interposed between the reflection film and the semitransparent reflection film and is thus not determined by the optical path length regulation layer. In consideration of the constitution of the generally used organic EL light-emitting layer, the thickness of the optical path length regulation layer of each of the R, G and B sub-pixels, in terms of physical thickness, is preferably 0 nm to 1000 nm, more preferably 20 nm to 500 nm, even more preferably 30 nm to 200 nm.

The method of forming the optical path length regulation layer is not particularly limited and can use, for example, a vacuum deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas-source CVD method, a coating method, a printing method, or a transfer method.

3. Organic Electroluminescence Layer

The organic luminescence layer in the invention may, besides the light-emitting layer, have conventionally known organic compound layers such as a hole transporting layer, an electron transporting layer, a blocking layer, an electron injecting layer and a hole injecting layer.

The organic electroluminescent device of the invention will be described in detail hereinafter.

1) Layer Structure

<Electrodes>

At least one of the pair electrodes of the organic electroluminescence layer of the invention is a transparent electrode, and the other is a back plate. The back plate may be transparent or opaque.

<Structure of the Organic Compound Layer>

The layer structure of the organic compound layer is not particularly limited, and may be suitably selected in accordance with the usage of the organic electroluminescent device or the target thereof. Preferably, the organic compound layer is formed on the transparent electrode or on the back plate. In this case, the organic compound layer is formed over the entire surface or on a part of the surface of the transparent electrode or the back plate.

The shape, the size, the thickness and other factors of the organic compound layer are not particularly limited, and can be suitably selected in accordance with the target.

Specific examples of the layer structure include the following. In the invention, however, the layer structure is not limited to these structures.

1. Anode/hole transporting layer/light emitting layer/electron transporting layer/cathode
2. Anode/hole transporting layer/light emitting layer/blocking layer/electron transporting layer/cathode
3. Anode/hole transporting layer/light emitting layer/blocking layer/electron transporting layer/electron injecting layer/cathode
4. Anode/hole injecting layer/hole transporting layer/light emitting layer/blocking layer/electron transporting layer/cathode
5. Anode/hole injecting layer/hole transporting layer/light emitting layer/blocking layer/electron transporting layer/electron injecting layer/cathode Each of the layers will be described in detail hereinafter.

2) Hole Transporting Layer

The hole transporting layer used in the invention comprises a hole transporting material. As the hole transporting material, a material having any one of a function of transporting holes and a function of blocking electrons injected from the cathode can be used without any special limitation. The hole transporting material used in the invention may be any one of a low molecular weight hole transporting material and a high molecular weight hole transporting material.

Specific examples of the hole transporting material used in the invention include the following:

A carbazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne compound, a porphyrin compound, a polysilane compound, a poly(N-vinylcarbazole) derivative, electroconductive polymers or oligomers such as an aniline copolymer, a thiophene oligomer and polythiophene, a polythiophene derivative, a polyphenylene derivative, a polyphenylenevinylene derivative, a polyfluorene derivative, and other polymer compounds.

These may be used alone or in combination of plural kinds thereof.

The thickness of the hole transporting layer is preferably 1 nm to 200 nm, more preferably 5 nm to 100 nm.

3) Hole Injecting Layer

In the invention, a hole injecting layer may be formed between the hole transporting layer and the anode.

The hole injecting layer is a layer which makes it easy to inject holes from the anode to the hole transporting layer. Specifically, a material having a small ionization potential among the above-mentioned various hole transporting materials is preferably used. Examples of the material include a phthalocyanine compound, a porphyrin compound, and a star-burst triarylamine compound. These can be preferably used.

The film thickness of the hole injecting layer is preferably 1 nm to 300 nm.

4) Light-Emitting Layer

The light-emitting layer used in the invention comprises at least one light-emitting material, and may comprise a hole transporting material, an electron transporting material, and a host material if necessary.

The light-emitting material used in the invention is not particularly limited, and may be any one of a fluorescent light-emitting material and a phosphorescent light-emitting material. The phosphorescent light-emitting material is preferable from the viewpoint of light-emitting efficiency.

One kind of light-emitting material may be used if white light can be emitted, or plural light-emitting materials may be simultaneously used. When plural light-emitting materials are simultaneously used, the combination of emission colors is not particularly limited, and examples include combined use of a blue light-emitting material and a yellow light-emitting material and combined use of a blue light-emitting material, a green light-emitting material and a red light-emitting material.

Examples of the fluorescent light-emitting material include a benzooxazole derivative, a benzoimidazole derivative, a benzothiazole derivative, a styrylbenzene derivative, a polyphenyl derivative, a diphenylbutadiene derivative, a tetraphenylbutadiene derivative, a naphthalimide derivative, a coumalin derivative, a perylene derivative, a peronone derivative, an oxadiazole derivative, an aldazine derivative, a pyrrolizine derivative, a cyclopentadiene derivative, a bisstyrylanthracene derivative, a quinacridone derivative, pyrrolopyridine derivative, a thiadiazolopyridine derivative, a styrylamine derivative, an aromatic dimethylidyne compound, various metal complexes, typical example of which include a metal complex of an 8-quinolinol derivative or a rare earth complex, and polymeric compounds such as a polythiophene derivative, a polyphenylene derivative, a polyphenylenevinylene derivative, and a polyfluorene derivative. These may be used alone or in combination of plural kinds thereof.

The phosphorescent light-emitting material is not particularly limited, and is preferably an orthometal metal complex or a porphyrin complex.

The above-mentioned orthometal metal complex is the generic name for the compound group mentioned in "Organic metal chemistry—basic and application—" written by Akio Yamamoto, p. 150, p. 232, Shokabo Publishing Co., Ltd., (published in 1982), "Photochemistry and photophysics of coordination compounds" written by H. Yersin, p. 71 to 77, p. 135 to 146, Springer-Verlag (published in 1987) and the like.

It is advantageous to use the orthometal metal complex in the luminescent layer as the light-emitting material in terms of obtaining a high luminosity and an excellent light-emitting efficiency.

Various kinds of ligands can be used for forming the above-mentioned orthometal metal complex, and examples thereof are described in the above-mentioned articles. Among them, preferable examples of the ligands include a 2-phenyl pyridine derivative, a 7,8-benzoquinoline derivative, a 2-(2-thienyl) pyridine derivative, a 2-(1-naphtyl) pyridine derivative, a 2-phenyl quinoline derivative and the like. These derivatives may have a substituent in accordance with necessity. Moreover, the above-mentioned orthometal metal complex may have another ligand in addition to the above-mentioned ligand.

The orthometal metal complex used in the present invention can be synthesized by various known methods such as those mentioned in: Inorg Chem., vol. 30, p. 1685 (1991); Inorg Chem., vol. 27, p. 3464 (1988); Inorg Chem., vol. 33, p. 545 (1994); Inorg. Chem. Acta, vol. 181, p. 245 (1991); J. Organomet. Chem., vol. 335, p. 293 (1987); J. Am. Chem. Soc. vol. 107, p. 1431 (1985); or the like.

Among the above-mentioned orthometal complexes, a compound which provide light emission by a triplet exciton can be preferably used in the present invention in terms of improvement of the light-emitting efficiency.

Moreover, among the porphyrin complexes, a porphyrin platinum complex is preferable. The phosphorescent light-emitting materials may be used alone or in combination of plural kinds thereof. One or more kinds of the fluorescent light-emitting materials and one or more kinds of the phosphorescent light-emitting materials may be used together.

The host material is a material which has a function of moving energy from an excited state thereof to a fluorescent light-emitting material or a phosphorescent light-emitting material, so as to cause the fluorescent or phosphorescent light-emitting material to emit light.

The host material is not particularly limited if the material is a compound capable of moving the energy of its excitons to the light-emitting material, and can be suitably selected in accordance with the purpose of the electroluminescent device. Specific examples thereof include a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydorazone derivative, a stylbene derivative, a silazane derivative, an aromatic tertiary amine compound, a styrylamine compound, an aromatic dimethylidyne compound, a porphyrin compound, an anthraquinodimethane derivative, an anthrone derivative, a diphenylquinone derivative, a thiopyrandioxide derivative, a carbodiimide derivative, a fluorenylidenemethane derivative, a distyrylpyrazine derivative, heterocyclic tetracarboxylic acid anhydrides such as naphthaleneperylene, various metal complexes, typical examples of which include metal complexes of a phthalocyanine derivative or 8-quinolinol derivative, metal phthalocyanine, and metal complexes each having, as a ligand thereof, benzooxazole or benzothiazole, electroconductive polymers/oligomers such as a polysilane compound, a poly(N-vinylcarbazole) derivative, an aniline copolymer, a thiophene oligomer and polythiophene, and polymeric compounds such as a polythiophene derivative, a polyphenylene derivative, a polyphenylenevinylene derivative and a polyfluorene derivative. These may be used alone or in combination of plural kinds thereof.

The content by percentage of the host material in the light-emitting layer is preferably 20 to 99.9% by mass, more preferably 50 to 99.0% by mass.

5) Blocking Layer

A blocking layer may be formed between the light-emitting layer and the electron transporting layer in the invention. The blocking layer is a layer for restraining the diffusion of excitons generated in the light-emitting layer, or restraining holes from penetrating toward the cathode.

The material used in the blocking layer is not particularly limited if the material is a material capable of receiving electrons from the electron transporting layer and delivering the electrons to the light-emitting layer. The material may be an ordinary electron transporting material. Examples thereof include the following: a triazole derivative, an oxazole derivative, an oxadiazole derivative, a fluorenone derivative, an anthraquinodimethane derivative, an anthrone derivative, a diphenylquinone derivative, a thiopyrandioxide derivative, a carbodiimide derivative, a fluorenylidenemethane derivative, a distyrylpyrazine derivative, heterocyclic tetracarboxylic acid anhydrides such as naphthaleneperylene, various metal complexes, typical examples of which include metal complexes of a phthalocyanine derivative or 8-quinolinol derivative, metal phthalocyanine, and metal complexes each having, as a ligand thereof, benzooxazole or benzothiazole, electroconductive polymers/oligomers such as an aniline copolymer, a thiophene oligomer and polythiophene, and polymeric compounds such as a polythiophene derivative, a polyphenylene derivative, a polyphenylenevinylene derivative and a polyfluorene derivative. These may be used alone or in combination of plural kinds thereof.

6) Electron Transporting Layer

An electron transporting layer comprising an electron transporting material can be deposited in the invention.

The electron transporting material is not limited if the material is a material having any one of a function of transporting electrons and a function of blocking holes injected from the anode. Examples of the electron transporting material given in the description of the blocking layer can be preferably used.

The thickness of the electron transporting layer is preferably 10 nm to 200 nm, more preferably 20 nm to 80 nm.

If the thickness is more than 100 nm, the driving voltage may unfavorably rise. If the thickness is less than 10 nm, the light-emitting efficiency of the electroluminescent device may unfavorably be impaired.

7) Electron Injecting Layer

An electron injecting layer may be formed between the electron transporting layer and the cathode in the invention.

The electron injecting layer is a layer which makes it easy to inject electrons from the cathode to the electron transporting layer. Preferable examples of the material used in this layer include alkali metal salts such as lithium fluoride, lithium chloride, lithium bromide, other lithium salts, sodium fluoride, sodium chloride and cesium fluoride, and insulating metal oxides such as lithium oxide, aluminum oxide, indium oxide and magnesium oxide.

The film thickness of the electron injecting layer is preferably 0.1 nm to 5 nm.

8) Substrate

The material of the substrate used in the invention is preferably a material through which water content cannot permeate, or a material having a very low water content permeability. Also, the material is preferably a material which does not cause scattering or attenuation of light emitted from the organic compound layer. Specific examples thereof include inorganic materials such as YSZ (yttria-stabilized zirconia) and glass, and organic materials such as polyethylene terephthalate, polybutylene terephthalate, polyethylene naphthalate, other polyesters, polystyrene, polycarbonate, polyethersulfone, polyarylate, allyl diglycol carbonate, polyimide, polycycloolefin, norbornene resin, poly(chlorotrifluoroethylene) and other synthetic resins. In the case of the organic materials, it is preferred that the organic materials are organic materials excellent in heat resistance, dimensional stability, solvent resistance, electric non-conductance, workability, low gas permeability and low hygroscopicity. The above-mentioned materials may be used alone or in combination of plural kinds thereof.

The shape, structure and size of the substrate and other factors thereof are not particularly limited, and can be suitably selected in accordance with the usage and purpose of the electroluminescent device. In general, the shape is a form of a plate. The structure may be a mono-layered structure or a multi-layered structure. The substrate may be made of a single member, or plural members.

The substrate may be transparent and colorless, or transparent and colored. The substrate is preferably transparent and colorless since the substrate does not cause scattering or attenuation of light emitted from the light-emitting layer.

It is preferable to form a moisture permeation preventing layer (gas barrier layer) on the front surface or the rear surface (on the side of the transparent electrode) of the substrate. The material of this layer is preferably an inorganic material such as silicon nitride or silicon oxide. This layer can be formed by, for example, high-frequency sputtering.

If necessary, a hard coat layer, an undercoat layer, or some other layer may be formed on the substrate.

9) Electrode

With respect to the electrodes in the invention, either the first or second electrode may be an anode or a cathode, but it is preferable that the first electrode is an anode and the second electrode is a cathode.

<Anode>

It is usually sufficient that the anode used in the invention has a function of supplying holes to the organic compound layer. The shape, structure and size thereof, and other factors thereof are not particularly limited, and can be suitably selected from known anodes in accordance with the usage and the purpose of the electroluminescent device.

Preferable examples of the material of the anode include metals, alloys, metal oxides, organic electroconductive compounds, and mixtures thereof. The material is preferably a material having a work function of 4.0 eV or more. Specific examples thereof include semiconductive metal oxides such as a tin oxide doped with antimony or fluorine (ATO, or FTO), tin oxide, zinc oxide, indium oxide, indium tin oxide (ITO) and indium zinc oxide (IZO), metals such as gold, silver, chromium and nickel, mixtures or laminates each made of one or more of these metals and an electroconductive metal oxide, inorganic electroconductive materials such as copper iodide and copper sulfide, organic electroconductive materials such as polyaniline, polythiophene and polypyrrole, and laminates each composed of one or more of these compounds and ITO.

The anode can be formed on the substrate in accordance with a method selected suitably, under consideration of suitability for the anode material, from wet methods such as printing and coating, physical methods such as vacuum vapor deposition, sputtering and ion plating, chemical methods such as CVD and plasma CVD, and other methods. In the case of selecting, for example, ITO as the anode material, the anode can be formed by direct current or high-frequency sputtering, vacuum vapor deposition, ion plating or the like.

In the case of selecting an organic electroconductive compound as the anode material, the anode can be formed by any wet film-forming method.

The position where the anode is formed in the electroluminescent device is not particularly limited, and can be suitably selected in accordance with the usage and the purpose of this element.

The anode may be patterned by a chemical etching such as photolithography or a physical etching such as laser etching. The patterning may be attained by vacuum vapor deposition or sputtering in a state that a mask is overlapped with the anode which has not yet been patterned, or may be attained by a lift-off method or a printing method.

The thickness of the anode can be suitably selected in accordance with the anode material. The thickness, which cannot be specified without reservation, is usually from 10 nm to 50 μm, preferably 50 nm to 20 μm.

The resistance value of the anode is preferably $10^3 \Omega/\square$ or less, more preferably $10^2 \Omega/\square$ or less.

The anode may be transparent and colorless, or transparent and colored. In order to take out light emitted from the side of the anode, the transmittance thereof is preferably 60% or more, more preferably 70% or more. This transmittance can be measured in a known method using a spectrophotometer.

Details of anodes are described in "New Development of Transparent Electrode Films", supervised by Yutaka Sawada and published by CMC (1999). These can be applied to the invention. The anode in the case of using a plastic substrate with low heat resistance is preferably an anode obtained by making ITO or IZO into a film at a low temperature of 150° C. or lower.

<Cathode>

It is usually sufficient that the cathode, which can be used in the invention, has a function of injecting electrons into the organic compound layer. The shape, structure and size thereof, and other factors thereof are not particularly limited, and can be suitably selected from known cathodes in accordance with the usage and the purpose of the electroluminescent device.

Examples of the material of the cathode include metals, alloys, metal oxides, electroconductive compounds, and mixtures thereof. The material is preferably a material having a work function of 4.5 eV or less. Specific examples thereof include alkali metals (such as Li, Na, K and Cs), alkaline earth metals (such as Mg, and Ca), gold, silver, lead, aluminum, sodium-potassium alloy, lithium-aluminum alloy, magnesium-silver alloy, indium, and rare earth metals such as ytterbium. These may be used alone. However, in order to make the stability and electron-injecting property of the cathode compatible with each other, it is preferable to use plural kinds thereof together.

Among them, alkali metals or alkaline earth metals are preferable from the viewpoint of electron injecting property. A material made mainly of aluminum is preferable since the material is excellent in storage stability. The material made mainly of aluminum means aluminum alone, or any alloy or mixture made of aluminum and 0.01 to 10% by mass of an alkali metal or alkaline earth metal (for example, lithium-aluminum alloy, or magnesium-aluminum alloy).

Materials of the cathode are described in detail in Japanese Patent Application Laid-Open (JP-A) Nos. 2-15595 and 5-121172. These can be applied to the invention.

The method for forming the cathode is not particularly limited, and may be a known method. For example, the cathode can be formed on the substrate in accordance with a method selected suitably, under consideration of suitability for the cathode material, from wet methods such as printing and coating, physical methods such as vacuum vapor deposition, sputtering and ion plating, chemical methods such as CVD and plasma CVD, and other methods. For example, when metals are selected as material for the cathode, one or more kinds thereof can be used simultaneously or successively according to sputtering method and the like.

The cathode may be patterned by a chemical etching such as photolithography or a physical etching such as laser etching. The patterning may be attained by vacuum vapor deposition or sputtering in a state that a mask is overlapped with the cathode which has not yet been patterned, or may be attained by a lift-off method or a printing method.

The position where the cathode is formed in the organic electroluminescent device is not particularly limited, and can be suitably selected in accordance with the usage and the purpose of the device. The cathode is preferably formed on the organic compound layer. In this case, the cathode may be formed on the whole of the organic compound layer or on a part of the layer.

A dielectric layer made of an alkali metal fluoride, an alkaline earth metal fluoride or the like may be inserted between the cathode and the organic compound layer so as to have a thickness of 0.1 nm to 5 nm.

The thickness of the cathode can be suitably selected in accordance with the cathode material. The thickness, which cannot be specified without reservation, is usually from 10 nm to 5 μm, preferably 20 nm to 500 nm.

The cathode may be transparent or opaque. The transparent electrode can be formed by making the cathode material into a film having a thickness of 1 nm to 10 nm and then laminating a transparent electroconductive material such as ITO or IZO onto the film.

10) Protective Layer

In the invention, the whole of the organic EL device may be protected with a protective layer.

Materials contained in the protective layer may be those having a function of preventing substances (for example, water and oxygen) accelerating deterioration of the device from entering the device.

Specific examples include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$ metal nitrides such as $SiN_x$ and $SiN_xO_y$, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a chlorotrifluoroethylene/dichlorodifluoroethylene copolymer, a copolymer obtained by copolymerizing a monomer mixture containing tetrafluoroethylene and at least one kind of comonomer, a fluorine-containing copolymer having a cyclic structure in a copolymer main chain, a water-absorbing substance with a water absorption percentage of 1% or more, and a dampproof substance with a water absorption percentage of 0.1% or less.

The method of forming the protective layer is not particularly limited and can use, for example, a vacuum deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas-source CVD method, a coating method, a printing method, or a transfer method.

11) Sealing

In addition, the whole of the organic electroluminescent device in the invention may be sealed with a sealing container.

A water absorbent or an inert liquid may be sealed in a space between the sealing container and the electroluminescent device.

The water absorbent includes, but is not limited to, barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. The inert liquid includes, but is not limited to, paraffins, liquid paraffins, fluorine solvents such as perfluoroalkane, perfluoroamine and perfluoroether, chlorine solvents and silicone oil.

12) Method for Manufacturing the Device

The layers constituting the device in the invention can be produced preferably by either a dry film-making method such as a vapor deposition method and a sputtering method, or a wet film-making method such as dipping, a spin coating method, a dip coating method, a casting method, a die coating method, a roll coating method, a bar coating method, and a gravure coating method.

Particularly, the dry method is preferable from the viewpoint of emission efficiency and durability. The wet film-making method is not preferable because a remaining coating solvent damages the light-emitting layer.

A resistance heating vacuum deposition method is particularly preferable. The resistance heating vacuum deposition method is advantageous in that since only a substance to be evaporated by heating under vacuum can be efficiently heated, the device is not exposed to high temperature and is thus less damaged.

Vacuum deposition is a method wherein in a vacuum container, a material to be vapor-deposited is gasified or sublimated by heating and then adhered by deposition onto the surface of a material placed a little distance away, thereby forming a thin film. Depending on the type of a deposition material and a material receiving the deposition material, the material is heated by a method such as resistance heating, electron beam method, high-frequency induction, or laser method. Among these methods, the vacuum deposition method in a resistance heating system is a method of forming a film at lowest temperature, wherein a material of high sublimation point cannot be formed into a film, but a material of low sublimation point can be formed into a film of a deposited material in a scarcely damaged state.

The sealing film material in the invention is capable of being formed into a film with vacuum deposition in a resistance heating system. Conventionally used sealants such as silicon oxide have a high sublimation point and have been hardly vapor-deposited by resistance heating. By the vapor deposition method such as an ion plating system described generally in known examples, a deposition origin is heated to an ultrahigh-temperature of several thousand degrees Celsius, thus thermally influencing and deteriorating a deposited material, and therefore the vapor deposition method is not suitable for the method of manufacturing a sealing film for an organic EL device to be particularly liable to influence by heating or with ultraviolet light.

13) Driving Method

The organic electroluminescent device in the invention can emit light by applying DC (which may if necessary contain an AC component) voltage cross the anode and cathode (usually 2 to 15 volts) or by applying DC electricity.

The method of driving the organic electroluminescent device in the invention can use driving methods described in JP-A Nos. 2-148687, 6-301355, 5-29080, 7-134558, 8-234685, 8-241047, Japanese Patent No. 2784615, U.S. Pat. No. 5,828,429 and U.S. Pat. No. 6,023,308.

(Application)

The display device of the invention is applied in a wide variety of broad fields including cell phone displays, personal digital assistants (PDA), computer displays, automotive information displays, TV monitors, and generic illumination.

Hereinafter, the exemplary embodiments of the invention are enumerated.

<1> A color display device comprising a plurality of pixels on a substrate, wherein each pixel comprises a plurality of sub-pixels, each sub-pixel emits light of different wavelengths in the visible range and further comprises a white sub-pixel, wherein the plurality of sub-pixels and the white sub-pixel each have a white organic electroluminescence layer interposed between an optically semitransparent reflection layer and a light reflection layer, the optical distance between the optically semitransparent reflection layer and the light reflection layer in each of the plurality of sub-pixels forms a resonator having a distance for resonating emitted light, and the optical distance between the optically semitransparent reflection layer and the light reflection layer in the white sub-pixel is longer than the maximum optical distance between the optically semitransparent reflection layer and the light reflection layer in each of the plurality of sub-pixels.

<2> The color display device of <1>, wherein the plural sub-pixels comprise a red sub-pixel, a green sub-pixel and a blue sub-pixel, and the optical distances between the optically semitransparent reflection layer and the light reflection layer in the red sub-pixel, green sub-pixel and blue sub-pixel are distances with which red light, green light and blue light are resonated respectively.

<3> The color display device of <1> or <2>, wherein the optical distance between the optically semitransparent reflection layer and the light reflection layer in the white sub-pixel is equal to or longer than twice the maximum optical distance between the optically semitransparent reflection layer and the light reflection layer in each of the plural sub-pixels.

<4> The color display device of any one of <1> to <3>, wherein the optical distance between the optically semitransparent reflection layer and the light reflection layer in the white sub-pixel is 2.0 μm or more.

<5> The color display device of any one of <1> to <4>, wherein the plural sub-pixels and the white sub-pixel each have a white organic electroluminescence layer having the same composition and have an optical path length regulation layer between the optically semitransparent reflection layer and the light reflection layer, and the thickness of the optical path length regulation layer varies among the sub-pixels.

<6> The color display device of any one of <1> to <5>, wherein the substrate is a substrate of a TFT, and at least one of the sub-pixels has a planarizing film on the substrate and has the light reflection layer on the planarizing film.

<7> The color display device of any one of <1> to <5>, wherein the substrate is a substrate of a TFT, and at least one of the sub-pixels has a planarizing film on the substrate and has the light reflection layer either between the planarizing film and the substrate or in the planarizing film.

<8> The color display device of <6> or <7>, wherein the substrate is a substrate of TFT and has a planarizing film thereon, the red sub-pixel, green sub-pixel and blue sub-pixel each have, on the planarizing film, the light reflection layer, the optically semitransparent reflection layer and an optical path length regulation layer and a white organic electroluminescence layer interposed between the optically semitransparent reflection layer and the light reflection layer, the white sub-pixel has the light reflection layer between the substrate and the planarizing film and has, on the planarizing film, a transparent electrode, the white organic electroluminescence layer, and the optically semitransparent reflection layer.

<9> The color display device of <8>, wherein the light reflection layer of the white sub-pixel is formed at a layer common with an electrode of the TFT.

<10> The color display device of any one of <2> to <9>, wherein a red color filter, a green color filter and a blue color filter are arranged at the light emission side of the red light-emitting sub-pixel, green light-emitting sub-pixel and blue light-emitting sub-pixel, respectively.

<11> A method for manufacturing a color display device having a plurality of pixels on a substrate, wherein:

each pixel comprises a red light-emitting sub-pixel, a green light-emitting sub-pixel, a blue light-emitting sub-pixel, a white sub-pixel, and each sub-pixel comprises a TFT that drives the sub-pixel, wherein the red light-emitting sub-pixel, green light-emitting sub-pixel, blue light-emitting sub-pixel and white sub-pixel each has an optical path length regulation layer and a white organic electroluminescence layer interposed between an optically semitransparent reflection layer and a light reflection layer, the optical distance between the optically semitransparent reflection layer and the light reflection layer in the red light-emitting sub-pixel, green light-emitting sub-pixel and blue light-emitting sub-pixel is a distance with which emitted lights are resonated respectively, and the optical distance between the optically semitransparent reflection layer and the light reflection layer in the white sub-pixel is longer than the maximum optical distance between the optically semitransparent reflection layer and the light reflection layer in the red sub-pixel, the method comprising:

1) covering the TFT for each of the red light-emitting sub-pixel, green light-emitting sub-pixel, blue light-emitting sub-pixel and white sub-pixel, to form a planarizing film, 2) forming a light reflection layer common among the red light-emitting sub-pixel, green light-emitting sub-pixel, blue light-emitting sub-pixel and white sub-pixel, 3) forming optical path length regulation layers of a material common among the red light-emitting sub-pixel, green light-emitting sub-pixel, blue light-emitting sub-pixel and white sub-pixel while changing the thickness of the layers, 4) forming transparent electrodes as pixel electrodes by patterning corresponding to the red light-emitting sub-pixel, green light-emitting sub-pixel, blue light-emitting sub-pixel and white sub-pixel, 5) forming a white organic luminescence layer common among the red light-emitting sub-pixel, green light-emitting sub-pixel, blue light-emitting sub-pixel and white sub-pixel, and 6) forming an optically semitransparent reflection layer common among the red light-emitting sub-pixel, green light-emitting sub-pixel, blue light-emitting sub-pixel and white sub-pixel.

<12> A method for manufacturing a color display device having a plurality of pixels on a substrate, wherein:

each pixel comprises a red light-emitting sub-pixel, a green light-emitting sub-pixel, a blue light-emitting sub-pixel, a white sub-pixel, and each sub-pixel comprises a TFT that drives the sub-pixel, wherein the red light-emitting sub-pixel, green light-emitting sub-pixel, blue light-emitting sub-pixel and white sub-pixel each has an optical path length regulation layer and a white organic electroluminescence layer interposed between an optically semitransparent reflection layer and a light reflection layer, the optical distance between the optically semitransparent reflection layer and the light reflection layer in the red light-emitting sub-pixel, green light-emitting sub-pixel and blue light-emitting sub-pixel is a distance with which emitted lights are resonated respectively, and the optical distance between the optically semitransparent reflection layer and the light reflection layer in the white sub-pixel is longer than the maximum optical distance between the optically semitransparent reflection layer and the light reflection layer in the red sub-pixel, the method comprising:

1) forming a light reflection layer for the white sub-pixel, on the same substrate on which the TFT has been formed, 2) covering the TFT for each of the red light-emitting sub-pixel, green light-emitting sub-pixel, blue light-emitting sub-pixel and white sub-pixel, and the light reflection layer for the white sub-pixel, to form a planarizing film, 3) forming a light reflection layer common among the red light-emitting sub-pixel, green light-emitting sub-pixel and blue light-emitting sub-pixel, 4) forming the optical path length regulation layers of a material common among the red light-emitting sub-pixel, green light-emitting sub-pixel and blue light-emitting sub-pixel while changing the thickness of the layers, 5) forming transparent electrodes as pixel electrodes by patterning corresponding to the red light-emitting sub-pixel, green light-emitting sub-pixel, blue light-emitting sub-pixel and white sub-pixel, 6) forming the white organic luminescence layer common among the red light-emitting sub-pixel, green light-emitting sub-pixel, blue light-emitting sub-pixel and white sub-pixel, and 7) forming the optically semitransparent reflection layer common among the red light-emitting sub-pixel, green light-emitting sub-pixel, blue light-emitting sub-pixel and white sub-pixel.

<13> A method for manufacturing a color display device having a plurality of pixels on a substrate, wherein:

each pixel comprises a red light-emitting sub-pixel, a green light-emitting sub-pixel, a blue light-emitting sub-pixel, a white sub-pixel, and each sub-pixel comprises a TFT that drives the sub-pixel, wherein the red light-emitting sub-pixel, green light-emitting sub-pixel, blue light-emitting sub-pixel and white sub-pixel each has an optical path length regulation layer and a white organic electroluminescence layer interposed between an optically semitransparent reflection layer and a light reflection layer, the optical distance between the optically semitransparent reflection layer and the light reflection layer in the red light-emitting sub-pixel, green light-emitting sub-pixel and blue light-emitting sub-pixel is a distance with which emitted lights are resonated respectively, and the optical distance between the optically semitransparent reflection layer and the light reflection layer in the white sub-pixel is longer than the maximum optical distance between the optically semitransparent reflection layer and the light reflection layer in the red sub-pixel, the method comprising:

1) forming a light reflection layer for the white sub-pixel, on the same substrate on which the TFT has been formed, 2) covering the TFT for each of the red light-emitting sub-pixel, green light-emitting sub-pixel, blue light-emitting sub-pixel and white sub-pixel, and the light reflection layer for the white sub-pixel, to form a planarizing film of first thickness, 3) forming a light reflection layer for the red light-emitting sub-pixel, 4) forming a planarizing film of second thickness for coverage throughout the red light-emitting sub-pixel, green light-emitting sub-pixel, blue light-emitting sub-pixel and white sub-pixel, 5) forming a light reflection layer for the green light-emitting sub-pixel, 6) forming a planarizing film of third thickness for coverage throughout the red light-emitting sub-pixel, green light-emitting sub-pixel, blue light-emitting sub-pixel and white sub-pixel, 7) forming a light reflection layer for the blue light-emitting sub-pixel, 8) forming a planarizing film of fourth thickness for coverage throughout the red light-emitting sub-pixel, green light-emitting sub-pixel, blue light-emitting sub-pixel and white sub-pixel, 9) forming transparent electrodes as pixel electrodes by patterning corresponding to the red light-emitting sub-pixel, green light-emitting sub-pixel, blue light-emitting sub-pixel and white sub-pixel, 10) forming the white organic luminescence layer common among the red light-emitting sub-pixel, green light-emitting sub-pixel, blue light-emitting sub-pixel and white sub-pixel, and 11) forming the optically semitransparent reflection layer common among the red light-emitting sub-pixel, green light-emitting sub-pixel, blue light-emitting sub-pixel and white sub-pixel.

EXAMPLES

Hereinafter, the present invention will be described with reference to the Examples, but the invention is not limited to these examples.

Example 1

The method of manufacturing the color display device of the invention with the constitution shown in FIG. 3 is described.

(1) On a glass substrate 1 provided with TFT, the TFT is covered with a planarizing film 6 of 3 μm in thickness. TFTs are arranged corresponding to R, G, B and W sub-pixels respectively.

(2) On the planarizing film 6, Al is arranged to a thickness of 100 nm as a light reflection layer 2 by patterning in R, G, B and W sub-pixels respectively by the vacuum film-forming method.

(3) On the upper surface of the light reflection layer 2, optical path length regulation layers 8-1, 8-2, 8-3 and 8-4 composed of a transparent insulating material which in the positions of R, G, B and W sub-pixels, is made different in film thickness.

Material: SiON
Film-forming method: ion plating method
Thickness: 120 nm in R region, 70 nm in G region, 30 nm in B region, and 2200 nm in W region.

(4) On the upper surface of the optical path length regulation layer, a transparent electrode 3 (ITO, 60 nm) is formed by patterning for each sub-pixel. The transparent electrode 3 over the planarizing film is electrically connected to TFT via a contact hole arranged in the optical path length regulation layer and in the reflection layer.

(5) While the light-emitting regions are covered with a metal mask, the non-light-emitting regions are covered with an insulating layer (bank 7).

(6) On the upper surface of the transparent electrode 3, a white light-emitting electroluminescence layer 4 and a optically semitransparent reflection layer 5 which are common among the R, G, B and W sub-pixels are formed consistently by the vacuum deposition method in the following order.

<Constitution of the Light-Emitting Layer>

Hole injecting layer: 4,4',4"-tris(2-naphthylphenylamino) triphenylamine (abbreviated as 2-TNATA) and tetrafluorotetracyanoquinodimethane (abbreviated as F4-TCNQ) in an amount of 1.0 mass % relative to 2-TNATA were co-deposited. The film thickness was 40 nm.

Hole transporting layer: N,N'-dinaphthyl-N,N'-diphenyl-[1,1'-biphenyl]-4,4'-diamine (abbreviated as α-NPD), thickness 10 nm.

Light-emitting layer: 1,3-bis(carbazol-9-yl)benzene (abbreviated as mCP) and emitting materials A, B and C in amounts of 15, 0.13 and 0.13 mass % respectively relative to mCP were subjected to quaternary co-deposition. The film thickness was 30 nm.

Electron transporting layer: bis-(2-methyl-8-quinolinolate)-4-(phenylphenolate)aluminum (abbreviated as BAlq), thickness 40 nm.

Electron injecting layer: LiF was deposited to a thickness of 0.5 nm and then Al was deposited to a thickness of 1.5 nm to form an electron injecting layer.

<Optically Semitransparent Reflection Layer 5>

A metal electrode (Ag, 20 nm) is formed by the vacuum film-making method.

Structures of the compounds used in this example are shown below:

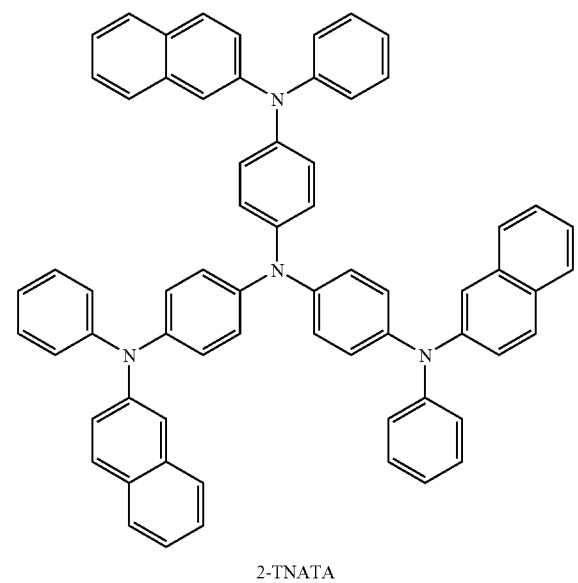

2-TNATA

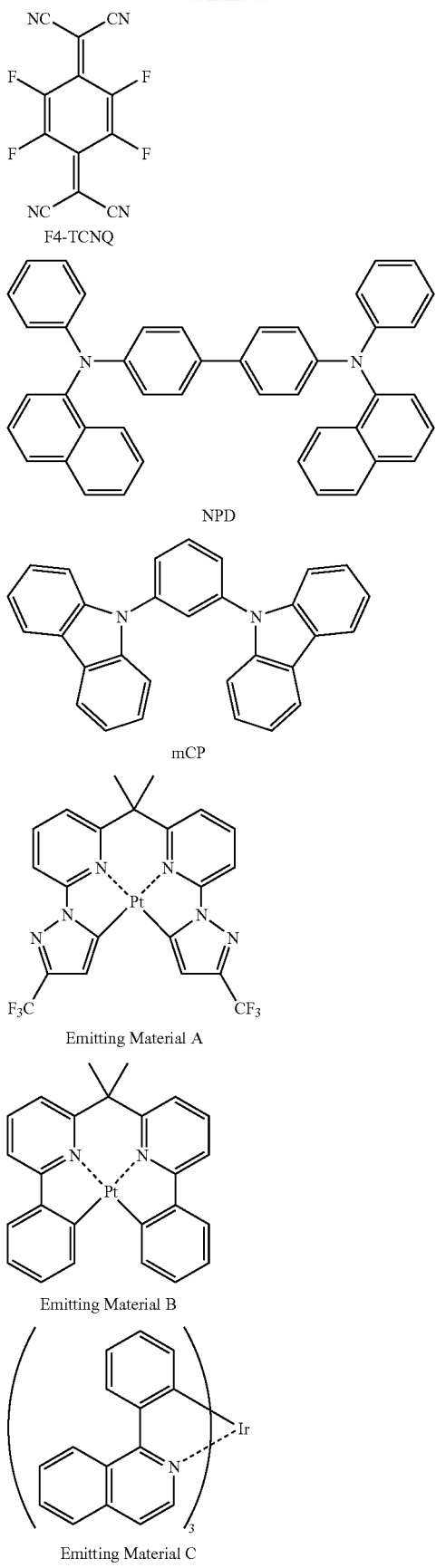

The resulting organic electroluminescence layer-forming region is sealed, and each electrode is connected to an external signal regulating device.

By the foregoing process, one pixel in which a top emission-type organic EL device has been integrated is formed.

Plural pixels each containing R, G, B and W sub-pixels are arranged to form a display surface, and the respective sub-pixels are allowed to selectively emit light thereby forming an image on the display surface.

Lights emitted in the white organic electroluminescence layer 4 upon electrification are resonated between the optically semitransparent reflection layer 5 and the light reflection layer 2, whereby R, G and B lights are emitted respectively via the semitransparent electrode 5 to the outside.

A high-luminance B light with the sharp emission spectrum shown in FIG. 6 is emitted from the B sub-pixel region; a high-luminance G light with the sharp emission spectrum shown in FIG. 7 is emitted from the G sub-pixel region; and a high-luminance R light with the sharp emission spectrum shown in FIG. 8 is emitted from the R sub-pixel region.

In the W sub-pixel region, a large number of resonance lights shown in FIG. 9 are mixed and emitted as light observed to be completely white light.

According to the production method described above, the R, G, B and W sub-pixels, which are different in only the thickness of their optical path length regulation layer, are composed of the same material. Particularly, the R, G, B and W sub-pixels have the organic electroluminescence layer and the optically semitransparent reflection layer in common, which can be consistently produced thus making formation of each pixel by separate forming unnecessary, simplifying the production process to increase productivity, and facilitating achievement of higher resolution.

Example 2

The pixel in this example has the constitution shown in FIG. 4 which is the same as in Example 1 except that the constitution of the W sub-pixel region was changed as follows. The method of manufacturing each component is the same as in Example 1.

(1) First, a light reflection layer 12-2 is arranged on a substrate 11 for a TFT.

(2) The TFT and light reflection layer 12-2 are covered by arranging a planarizing film 16. The step of arranging the planarizing film 16 is carried out by the same step as in arranging the planarizing film 16 in the R, G and B sub-pixel regions.

(3) The subsequent steps of laminating a transparent electrode 13/white organic electroluminescence layer 14/optically semitransparent reflection layer 15 are carried out by the same steps as in the R, G and B sub-pixel regions.

In the constitution obtained above, the planarizing film 16 in the W sub-pixel region functions as a substitute for the optical path length regulation layer. In this example as compared with Example 1, it is not particularly necessary to arrange the thick optical path length regulation layer in the W sub-pixel region, thus making the process further easy, and the W sub-pixel region does not become particularly thick compared to the R, G and B sub-pixel regions, whereby the entire pixel is planarized with resuced depressions and protrusions, which is preferable.

Example 3

The pixel in this example has the constitution shown in FIG. 5 which is the same as in Example 2 except that even in the R, G and B sub-pixel regions, the light reflection layer is arranged in the planarizing film 26.

(1) On substrate 21 for TFT, a light reflection layer 22-4 is first formed for W sub-pixel.

(2) Throughout R, G, B and W sub-pixel regions, TFT and a light reflection layer 22-2 are covered by arranging a planarizing film of first thickness.

(3) Then, a light reflection layer 22-3 is arranged for R sub-pixel.

(4) Subsequently, a planarized plate of second thickness is arranged throughout the R, G, B and W sub-pixel regions.

(5) Then, a light reflection layer 22-2 is arranged for G sub-pixel.

(6) Subsequently, a planarizing film of third thickness is arranged throughout the R, G, B and W sub-pixel regions.

(7) Then, a light reflection layer 22-1 is arranged for B sub-pixel.

(8) Subsequently, a planarizing film of fourth thickness is arranged throughout the R, G, B and W sub-pixel regions.

(9) The subsequent step of forming a laminate of a transparent electrode 23/white organic electroluminescence layer 24/optically semitransparent reflection layer 25 that are common among the R, G, B and W sub-pixels is carried out in the same manner as in Examples 1 and 2.

In the constitution obtained above, the optical path length regulation layers in all the sub-pixel regions are arranged in the planarizing film. Accordingly, particular arrangement of the optical path length regulation layers outside the planarizing film is unnecessary, thus allowing all the R, G, B and W sub-pixel regions to be formed with the same thickness, thereby preferably planarizing the whole of the pixel with reduced depression and protrusion. Further, the transparent electrodes, the white organic electroluminescence layers or the optically semitransparent reflection layers in the sub-pixel regions can be formed of the same material in the same step, thus making the production process simple and facilitating achievement of higher resolution.

According to the invention, there are provided a color display device that is capable of high-resolution color display and easily producible and a method for manufacturing the same. Particularly, organic electroluminescence layers can be formed in common among all pixels including sub-pixels, and so the separate forming, depending on the color of emitted light, of the organic electroluminescence layer region is not necessary. Furthermore, optical path length regulation layers for forming a resonant structure can be formed of a material common among the sub-pixels by merely changing the thickness of the material.

Conventionally, when a resonant structure is provided in each of R, G and B sub-pixels and a resonant structure is also provided in a white sub-pixel, a specific wavelength is resonated in the white sub-pixel region, and as a result, the white sub-pixel assumes specific color thus making suitable color reproduction difficult. To allow only the white sub-pixel region to be constituted so as not to have a resonant structure complicates not only the constitution of the device but also the production process, and makes achievement of higher resolution difficult.

According to the invention, the optical path length regulation layer in the white sub-pixel region is thicker than the optical path length regulation layer for the red light-emitting layer, and emission of specific color is not substantially generated.

What is claimed is:

1. A color display device comprising a plurality of pixels on a substrate, wherein each pixel comprises a plurality of sub-pixels, the sub-pixels each emitting light of different wavelengths in the visible range, and further comprises a white sub-pixel, wherein:

the plurality of sub-pixels and the white sub-pixel each have a white organic electroluminescence layer interposed between an optically semitransparent reflection layer and a light reflection layer, the optical distance between the optically semitransparent reflection layer and the light reflection layer in each of the plurality of sub-pixels forms a resonator having a distance for resonating emitted light, the optical distance between the optically semitransparent reflection layer and the light reflection layer in the white sub-pixel is longer than the maximum optical distance between the optically semitransparent reflection layer and the light reflection layer in each of the plurality of sub-pixels, the substrate is a substrate of a TFT, and at least one of the sub-pixels has a planarizing film on the substrate and has the light reflection layer either between the planarizing film and the substrate or in the planarizing film, and the plurality of sub-pixels and the white sub-pixel each have a white organic electroluminescence layer having the same composition, sub-pixels other than the sub-pixels having the light reflection layer between the planarizing film and the substrate or in the planarizing film have an optical path length regulation layer between the optically semitransparent reflection layer and the light reflection layer, and the thickness of the optical path length regulation layer varies among the sub-pixels.

2. The color display device of claim 1, wherein the plurality of sub-pixels comprise a red sub-pixel, a green sub-pixel and a blue sub-pixel, and the optical distances between the optically semitransparent reflection layer and the light reflection layer in the red sub-pixel, green sub-pixel and blue sub-pixel are distances with which red light, green light and blue light are resonated respectively.

3. The color display device of claim 1, wherein the optical distance between the optically semitransparent reflection layer and the light reflection layer in the white sub-pixel is equal to or longer than twice the maximum optical distance between the optically semitransparent reflection layer and the light reflection layer in each of the plurality of sub-pixels.

4. The color display device of claim 1, wherein the optical distance between the optically semitransparent reflection layer and the light reflection layer in the white sub-pixel is 2.0 µm or more.

5. The color display device of claim 1, wherein at least one sub-pixel other than the sub-pixels having the light reflection layer between the planarizing film and the substrate or in the planarizing film has the light reflection layer on the planarizing film.

6. The color display device of claim 5, wherein:
the substrate has a planarizing film thereon,
the plurality of sub-pixels comprise a red sub-pixel, a green sub-pixel and a blue sub-pixel,
the red sub-pixel, green sub-pixel and blue sub-pixel each have, on the planarizing film, the light reflection layer, the optically semitransparent reflection layer and an optical path length regulation layer and the white organic electroluminescence layer interposed between the optically semitransparent reflection layer and the light reflection layer, and
the white sub-pixel has the light reflection layer between the substrate and the planarizing film and has, on the planarizing film, a transparent electrode, the white organic electroluminescence layer, and the optically semitransparent reflection layer.

7. The color display device of claim 6, wherein the light reflection layer of the white sub-pixel is formed at a layer common with an electrode of the TFT.

8. The color display device of claim 2, wherein a red color filter, a green color filter and a blue color filter are arranged at the light emission side of the red light-emitting sub-pixel, green light-emitting sub-pixel and blue light-emitting sub-pixel, respectively.

9. A method for manufacturing a color display device, comprising a plurality of pixels on a substrate, wherein each pixel comprises a plurality of sub-pixels, the sub-pixels each emitting light of different wavelengths in the visible range, and further comprises a white sub-pixel, wherein:
the plurality of sub-pixels and the white sub-pixel each have a white organic electroluminescence layer interposed between an optically semitransparent reflection layer and a light reflection layer,
the optical distance between the optically semitransparent reflection layer and the light reflection layer in each of the plurality of sub-pixels forms a resonator having a distance for resonating emitted light,
the optical distance between the optically semitransparent reflection layer and the light reflection layer in the white sub-pixel is longer than the maximum optical distance between the optically semitransparent reflection layer and the light reflection layer in each of the plurality of sub-pixels, and
the plurality of sub-pixels comprise a red sub-pixel, a green sub-pixel and a blue sub-pixel, and the optical distances between the optically semitransparent reflection layer and the light reflection layer in the red sub-pixel, green sub-pixel and blue sub-pixel are distances with which red light, green light and blue light are resonated respectively,
the method comprising:
forming a light reflection layer for the white sub-pixel, on the same substrate on which the TFT has been formed,
covering the TFT for each of the red light-emitting sub-pixel, green light-emitting sub-pixel, blue light-emitting sub-pixel and white sub-pixel, and the light reflection layer for the white sub-pixel, to form a planarizing film,
forming a light reflection layer common among the red light-emitting sub-pixel, green light-emitting sub-pixel and blue light-emitting sub-pixel,
forming optical path length regulation layers of a material common among the red light-emitting sub-pixel, green light-emitting sub-pixel and blue light-emitting sub-pixel while changing the thickness of the layers,
forming transparent electrodes as pixel electrodes by patterning corresponding to the red light-emitting sub-pixel, green light-emitting sub-pixel, blue light-emitting sub-pixel and white sub-pixel,
forming the white organic luminescence layer common among the red light-emitting sub-pixel, green light-emitting sub-pixel, blue light-emitting sub-pixel and white sub-pixel, and
forming the optically semitransparent reflection layer common among the red light-emitting sub-pixel, green light-emitting sub-pixel, blue light-emitting sub-pixel and white sub-pixel.

10. A method for manufacturing a color display device, comprising a plurality of pixels on a substrate, wherein each pixel comprises a plurality of sub-pixels, the sub-pixels each emitting light of different wavelengths in the visible range, and further comprises a white sub-pixel, wherein:
the plurality of sub-pixels and the white sub-pixel each have a white organic electroluminescence layer interposed between an optically semitransparent reflection layer and a light reflection layer,
the optical distance between the optically semitransparent reflection layer and the light reflection layer in each of the plurality of sub-pixels forms a resonator having a distance for resonating emitted light,
the optical distance between the optically semitransparent reflection layer and the light reflection layer in the white sub-pixel is longer than the maximum optical distance between the optically semitransparent reflection layer and the light reflection layer in each of the plurality of sub-pixels, and
the plurality of sub-pixels comprise a red sub-pixel, a green sub-pixel and a blue sub-pixel, and the optical distances between the optically semitransparent reflection layer and the light reflection layer in the red sub-pixel, green sub-pixel and blue sub-pixel are distances with which red light, green light and blue light are resonated respectively,
the method comprising:
forming a light reflection layer for the white sub-pixel, on the same substrate on which the TFT has been formed,
covering the TFT for each of the red light-emitting sub-pixel, green light-emitting sub-pixel, blue light-emitting sub-pixel and white sub-pixel, and the light reflection layer for the white sub-pixel, to form a planarizing film of first thickness,
forming a light reflection layer for the red light-emitting sub-pixel,
forming a planarizing film of second thickness for coverage throughout the red light-emitting sub-pixel, green light-emitting sub-pixel, blue light-emitting sub-pixel and white sub-pixel,
forming a light reflection layer for the green light-emitting sub-pixel,
forming a planarizing film of third thickness for coverage throughout the red light-emitting sub-pixel, green light-emitting sub-pixel, blue light-emitting sub-pixel and white sub-pixel,
forming a light reflection layer for the blue light-emitting sub-pixel,
forming a planarizing film of fourth thickness for coverage throughout the red light-emitting sub-pixel, green light-emitting sub-pixel, blue light-emitting sub-pixel and white sub-pixel,
forming transparent electrodes as pixel electrodes by patterning corresponding to the red light-emitting sub-pixel, green light-emitting sub-pixel, blue light-emitting sub-pixel and white sub-pixel, forming the white organic luminescence layer common among the red light-emitting sub-pixel, green light-emitting sub-pixel, blue light-emitting sub-pixel and white sub-pixel, and forming the optically semitransparent reflection layer common among the red light-emitting sub-pixel, green light-emitting sub-pixel, blue light-emitting sub-pixel and white sub-pixel.

11. The color display device of claim 1, wherein the light reflection layer is electrically separate from the TFT.

12. A color display device obtained by a method comprising:

forming a light reflection layer for a white sub-pixel, on a substrate on which a TFT has been formed, covering the TFT for each of a red light-emitting sub-pixel, a green light-emitting sub-pixel, a blue light-emitting sub-pixel and the white sub-pixel, and the light reflection layer for the white sub-pixel, to form a planarizing film, forming a light reflection layer common among the red light-emitting sub-pixel, green light-emitting sub-pixel and blue light-emitting sub-pixel, forming optical path length regulation layers of a material common among the red light-emitting sub-pixel, the green light-emitting sub-pixel and the blue light-emitting sub-pixel while changing the thickness of the layers, forming transparent electrodes as pixel electrodes by patterning corresponding to the red light-emitting sub-pixel, the green light-emitting sub-pixel, the blue light-emitting sub-pixel and the white sub-pixel, forming a white organic luminescence layer common among the red light-emitting sub-pixel, the green light-emitting sub-pixel, the blue light-emitting sub-pixel and the white sub-pixel, and forming an optically semitransparent reflection layer common among the red light-emitting sub-pixel, the green light-emitting sub-pixel, the blue light-emitting sub-pixel and the white sub-pixel.

13. A color display device comprising a plurality of pixels on a substrate, wherein each pixel comprises a plurality of sub-pixels, the sub-pixels each emitting light of different wavelengths in the visible range, and further comprises a white sub-pixel, wherein the plurality of sub-pixels and the white sub-pixel each have a white organic electroluminescence layer interposed between an optically semitransparent reflection layer and a flat light reflection layer, the optical distance between the optically semitransparent reflection layer and the light reflection layer in each of the plurality of sub-pixels forms a resonator having a distance for resonating emitted light, the optical distance between the optically semitransparent reflection layer and the light reflection layer in the white sub-pixel is longer than the maximum optical distance between the optically semitransparent reflection layer and the light reflection layer in each of the plurality of sub-pixels, and the substrate is a substrate of a TFT, and at least one of the sub-pixels has a planarizing film on the substrate and has the light reflection layer either between the planarizing film and the substrate or in the planarizing film.

* * * * *